United States Patent
Kim et al.

(10) Patent No.: US 9,426,882 B2
(45) Date of Patent: Aug. 23, 2016

(54) FLEXIBLE PRINTED CIRCUIT FOR CONNECTING TOUCH SCREEN AND LIQUID CRYSTAL DISPLAY DEVICE USING THE SAME

(71) Applicant: LG DISPLAY CO., LTD., Seoul (KR)

(72) Inventors: SungChul Kim, Goyang-si (KR); Sujin Kwon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 389 days.

(21) Appl. No.: 13/839,540

(22) Filed: Mar. 15, 2013

(65) Prior Publication Data

US 2013/0241873 A1 Sep. 19, 2013

(30) Foreign Application Priority Data

Mar. 16, 2012 (KR) .................. 10-2012-0026994

(51) Int. Cl.
| | |
|---|---|
| *G06F 3/041* | (2006.01) |
| *H05K 1/02* | (2006.01) |
| *G02F 1/1333* | (2006.01) |
| *G06F 3/044* | (2006.01) |
| *G02F 1/1345* | (2006.01) |

(52) U.S. Cl.
CPC .......... *H05K 1/0228* (2013.01); *G02F 1/13338* (2013.01); *G06F 3/044* (2013.01); *G06F 3/0418* (2013.01); *G02F 1/13452* (2013.01); *G06F 3/0412* (2013.01); *H05K 2201/09672* (2013.01)

(58) Field of Classification Search
CPC ... G06F 3/044; G06F 3/0412; G06F 1/13338; G06F 1/13452
USPC ..................................................... 345/173
See application file for complete search history.

(56) References Cited

U.S. PATENT DOCUMENTS

| | | | | |
|---|---|---|---|---|
| 8,508,503 | B2 * | 8/2013 | Lin et al. ................. | 345/174 |
| 8,564,565 | B2 * | 10/2013 | Westhues ........... | G06F 3/0412 178/18.01 |
| 8,638,399 | B2 * | 1/2014 | Wang et al. ............... | 349/12 |
| 8,711,570 | B2 * | 4/2014 | Hotelling et al. ......... | 361/749 |
| 8,736,573 | B2 * | 5/2014 | Byun et al. ................ | 345/174 |
| 2008/0062139 | A1 * | 3/2008 | Hotelling et al. ......... | 345/173 |
| 2010/0156846 | A1 * | 6/2010 | Long ................... | G06F 3/044 345/174 |
| 2010/0193257 | A1 * | 8/2010 | Hotelling et al. ........ | 178/18.06 |
| 2011/0134075 | A1 * | 6/2011 | Takusa ................ | G06F 3/044 345/174 |
| 2013/0069904 | A1 * | 3/2013 | Krah ......................... | 345/174 |

* cited by examiner

*Primary Examiner* — Chanh Nguyen
*Assistant Examiner* — Yuzhen Shen
(74) *Attorney, Agent, or Firm* — Birch, Stewart, Kolasch & Birch, LLP

(57) ABSTRACT

Discussed is a Flexible Printed Circuit (FPC). The FPC includes a plurality of touch lines respectively connected to a plurality of touch electrode lines, a first film adhered to the touch lines, a second film overlapping the first film at an upper end surface of the first film and covering the touch lines, and a feedback compensation signal electrode adhered to a lower end surface of the first film, and receiving a feedback compensation signal for removing noise.

9 Claims, 8 Drawing Sheets

FLEXIBLE PRINTED CIRCUIT FOR CONNECTING TOUCH SCREEN AND LIQUID CRYSTAL DISPLAY DEVICE USING THE SAME

CROSS-REFERENCE TO RELATED APPLICATIONS

This application claims the benefit of the Korean Patent Application No. 10-2012-0026994 filed on Mar. 16, 2012, which is hereby incorporated by reference as if fully set forth herein.

BACKGROUND

1. Field of the Invention

The present invention relates to a Flexible Printed Circuit (FPC), and more particularly, to an FPC for connecting a touch screen to a touch board with a touch IC mounted thereon and a liquid crystal display (LCD) device using the same.

2. Discussion of the Related Art

Among various types of flat panel display devices, LCD devices are being expanded in application field because the LCD devices are easily manufactured and have drivability of drivers, high image quality and a large screen.

Recently, instead of an input device such as a mouse or a keyboard which is conventionally applied to LCD devices, a touch screen that enables a user to directly input information with a finger or a pen is applied as an input device to LCD devices.

Especially, in portable terminals such as smart phones, LCD devices with a built-in touch screen in which the touch screen is built in a liquid crystal panel for slimming are developed.

FIGS. 1A and 1B are exemplary diagrams respectively illustrating general equivalent circuits of a touch screen. FIG. 1A illustrates an equivalent circuit. FIG. 1B shows a waveform of an output sensing signal (Rx signal) having noise (noise common voltage) "Vcom noise" caused by a common voltage when a driving signal (Tx signal) is applied to the touch screen so as to sense a touch.

A related art LCD device including a touch screen includes a panel including a touch screen 20; a main board (main PCB) on which a timing controller or a display driver IC (DDI) (hereinafter simply referred to as a controller), connected to an external system, for controlling the driving of gate lines and data lines inside a panel is mounted; a panel connection part for connecting the panel and the controller; a touch board (touch PCB) on which a touch screen driver IC 30 (hereinafter simply referred to as a touch IC) for driving the touch screen is mounted; and an FPC for connecting the touch screen and the touch IC.

In the LCD device including the touch screen, as illustrated in FIG. 1A, an equivalent circuit of the touch screen 20 includes a driving signal resistor $R_{TX}$ connected to the touch driver 10 that applies the driving signal (Tx signal) to the touch screen 20, a sensing signal resistor $R_{RX}$ connected to a touch sensing unit of the touch IC 30, and a plurality of capacitors $C_{Mutual}$, $C_{TX}$ and $C_{RX}$ which are connected to each other in series or parallel. Here, the touch driver 10 and the touch sensing unit may be included in the touch IC 30 included in the touch board.

In the related art LCD device including the touch screen, the touch driver 10 outputs the driving signal to a driving electrode of the touch screen 20 so as to sense a touch, and the touch IC 30 determines whether there is a touch by using the level of a sensing signal which is input to the touch sensing unit through a receiving electrode of the touch screen 20.

In the LCD device, the common voltage Vcom is applied to the panel for driving the panel. In this case, the common voltage Vcom passes through common electrodes and common lines of the panel, at which point noise is added into the common voltage by an interaction between elements (gate line, data line, pixel electrode, etc.) disposed in the panel.

When the touch IC 30 is determining whether there is a touch by using a driving signal and a sensing signal, the sensing signal overlaps the common voltage including noise (hereinafter simply referred to as a noise common voltage). For this reason, the sensing signal input to the touch sensing unit of the touch IC 30 inevitably includes noise unlike the driving signal (Tx signal) output from the touch driver 10. Therefore, the driving signal and the sensing have different waveforms. That is, as shown in FIG. 1B, due to the unstable noise common voltage, the sensing signal (Rx signal) received through the receiving electrode is input to the touch IC 30 with the sensing signal including noise.

The touch sensing performance of the touch IC 30 can be degraded by the sensing signal (Rx signal) including noise which is input to the touch IC 30. That is, since a signal affected by noise occurring in the panel is added into the sensing signal (Rx signal) input to the touch IC 30, immunity of the touch IC 30 to noise is reduced in sensing a touch. For this reason, a touch sensitivity of the touch IC 30 can be reduced, and, the reduction in the touch sensitivity greatly affects the touch sensing of the touch IC 30, whereby a desired sensing result cannot be obtained.

To overcome the above-described limitations, technology is developed in which a feedback compensation signal for counteracting the noise common voltage is applied to the touch IC 30, and thus, the touch IC 30 removes the noise from a sensing signal.

However, in the above-described related art, since a new function is added to the touch IC 30, the structure of the touch IC 30 is complicated.

Moreover, in the related art, since a new function and structure should be added to the touch IC 30, the costs of the touch IC and LCD device increase.

SUMMARY

Accordingly, the present invention is directed to provide an FPC for connecting a touch screen and an LCD device using the same that substantially obviate one or more problems due to limitations and disadvantages of the related art.

An aspect of the present invention is directed to provide an FPC for connecting a touch screen and an LCD device using the same, in which a feedback compensation signal electrode receiving a feedback compensation signal for counteracting noise occurring in a panel and a touch line connected to a touch electrode disposed in the touch screen are provided in plurality.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an FPC for connecting a touch screen which includes: a plurality of touch lines respectively connected to a plurality of touch electrode lines; a first film adhered to the touch lines; a second film overlapping the first film at an upper end surface of the first film and covering the touch lines; and a feedback compensation signal electrode adhered to a lower end surface of the first film, and receiving a feedback compensation signal for removing noise.

In another aspect of the present invention, there is provided an LCD device including: a panel, a plurality of data lines and a plurality of gate line being arranged in the panel; a touch screen including a plurality of touch electrodes for sensing a touch; a plurality of touch electrode lines respectively connected to the touch electrodes; a touch IC determining whether the touch electrodes are touched using a sensing signal generated by a driving signal applied to the touch electrodes; a touch board connector mounted on the touch board with the touch IC mounted thereon, and connected to the touch IC; an FPC connecting the touch electrode lines to the touch board connector; a common voltage generator supplying a common voltage to a plurality of common electrodes disposed in the panel; and a compensation signal generator inverting a noise signal fed back from the panel to generate a feedback compensation signal, and transferring the feedback compensation signal to the touch board connector, wherein a feedback compensation signal electrode receiving the feedback compensation signal through the touch board connector is disposed in the FPC.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 1A:
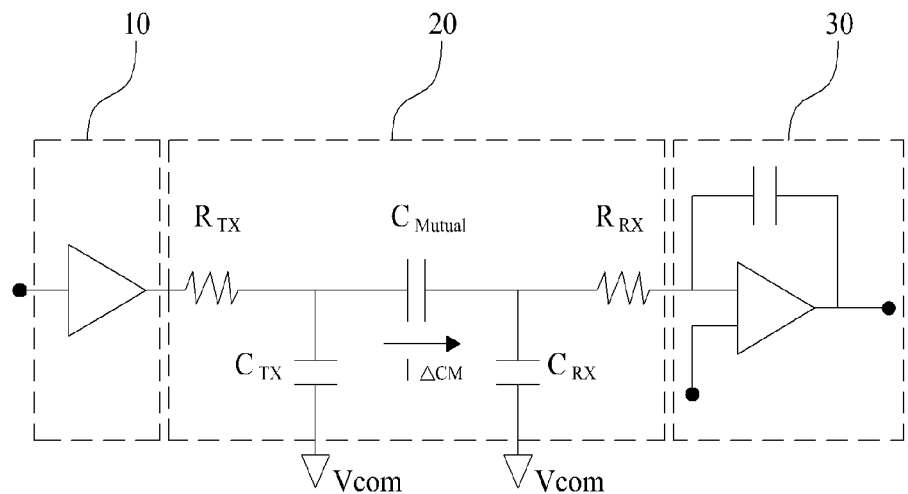
FIGS. 1A and 1B are exemplary diagrams respectively illustrating general equivalent circuits of a touch screen.
Figure 1B:
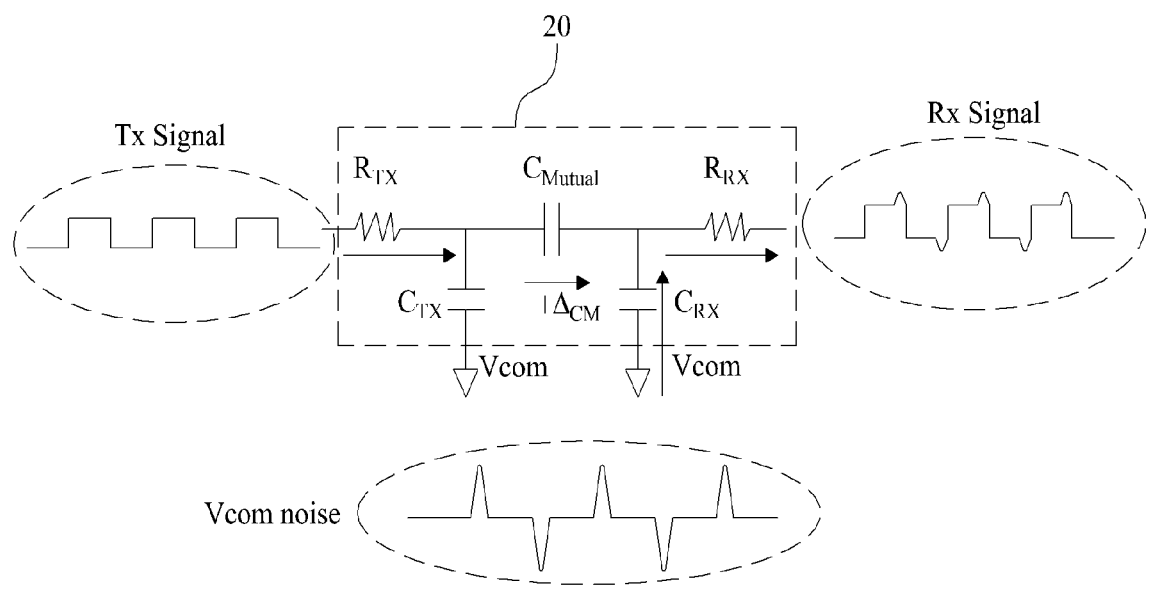
Figure 2:
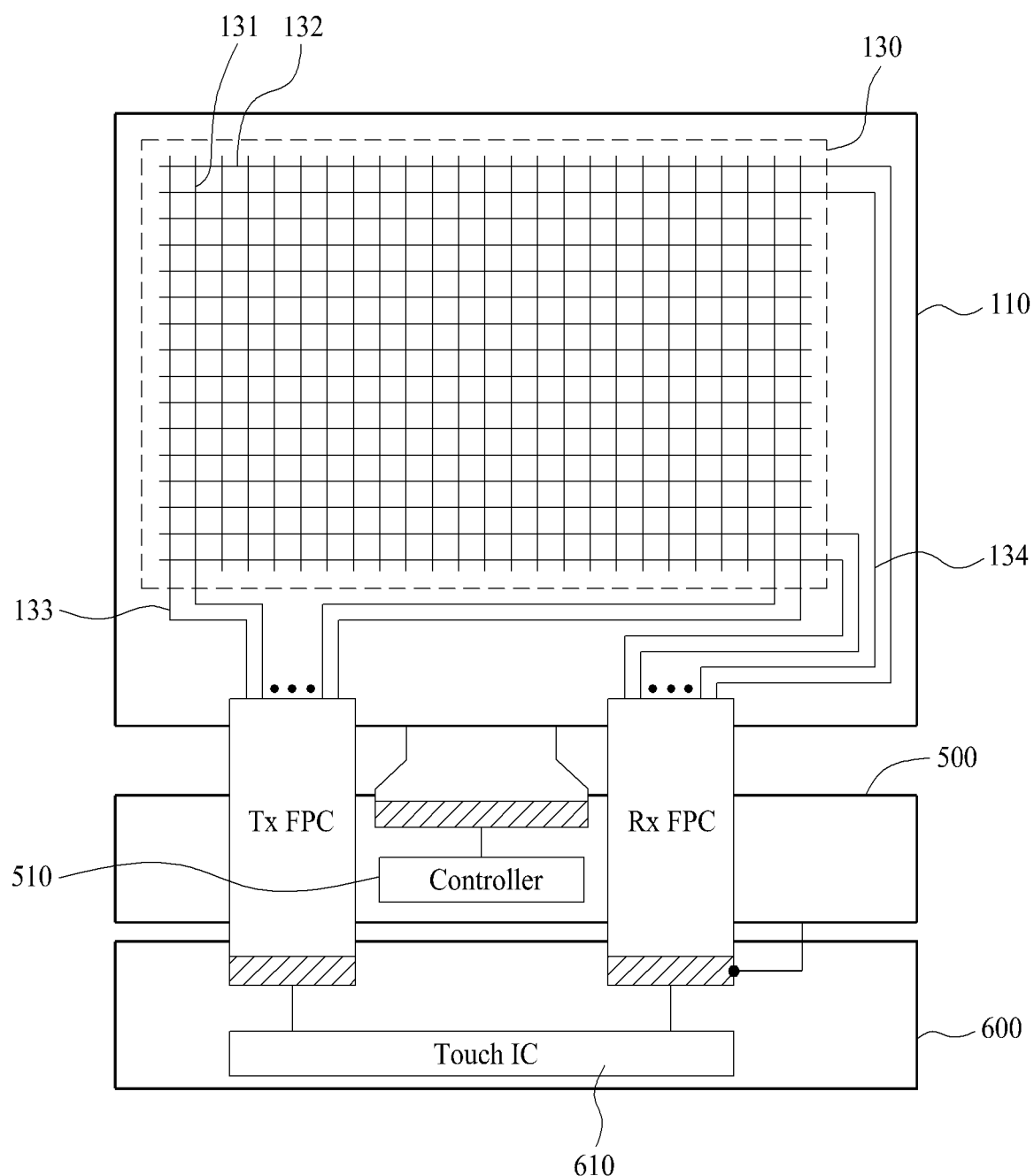
FIG. 2 is an exemplary diagram illustrating a configuration of an LCD device according to the present invention.
Figure 3:
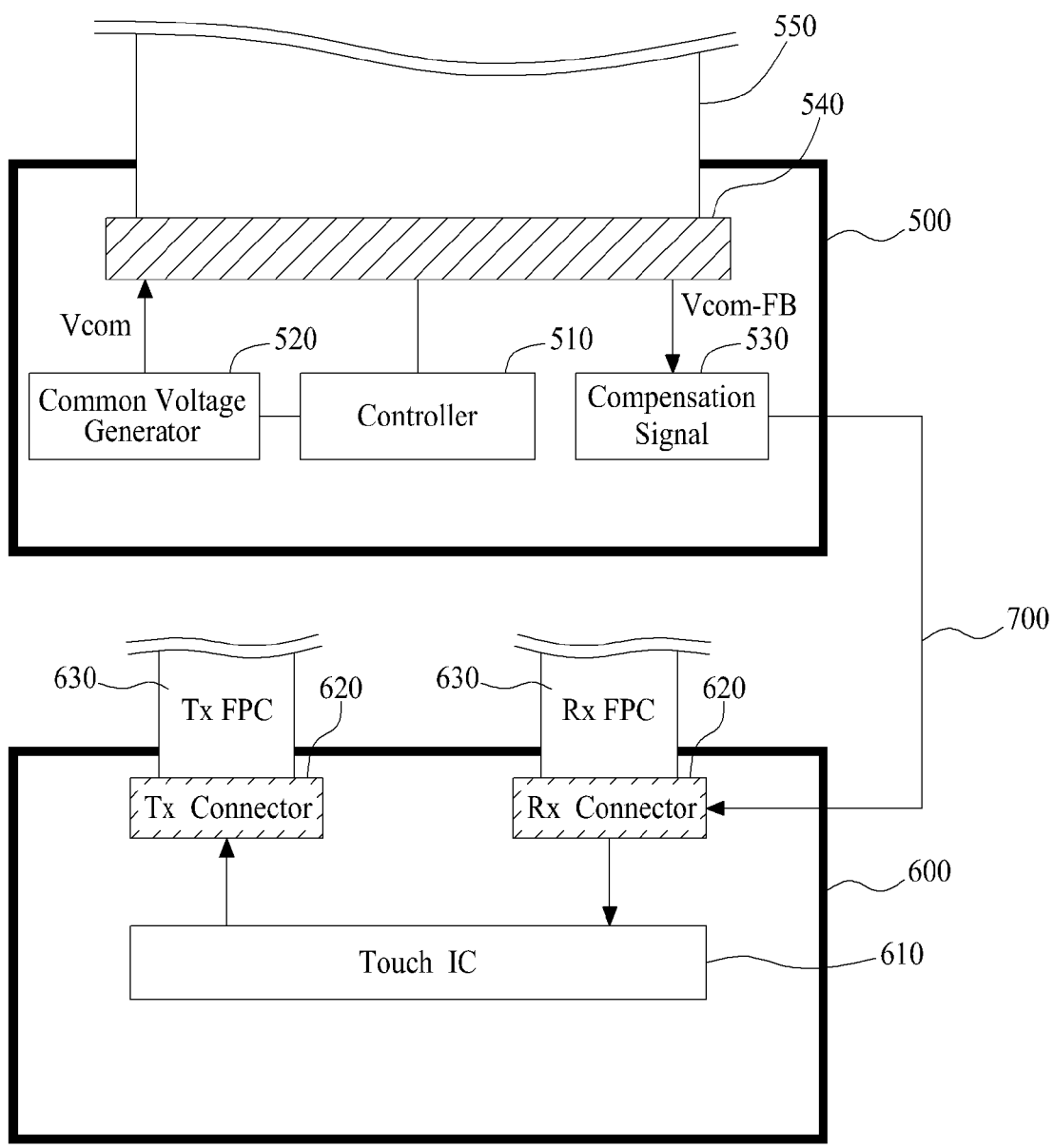
FIG. 3 is an exemplary diagram illustrating a configuration of a main board with a controller mounted thereon and a touch board mounted a touch IC mounted thereon, among elements of the LCD device according to the present invention.

FIG. 2 is an exemplary diagram illustrating a configuration of an LCD device according to the present invention. FIG. 3 is an exemplary diagram illustrating a configuration of a main board 500 with a controller 510 mounted thereon and a touch board 600 mounted a touch IC 610 mounted thereon, among elements of the LCD device according to the present invention.

The present invention relates to an LCD device including a touch screen driven in a capacitive type, and is particularly characterized in that a feedback compensation signal electrode receiving a feedback compensation signal for counteracting noise occurring in a panel and a touch electrode line connected to a touch electrode disposed in a touch screen are provided in an FPC for connecting the touch screen and a touch board (touch PCB), a sensing signal from which noise has been removed is applied to a touch IC, thus enhancing the touch sensitivity of the touch IC.

To this end, as illustrated in FIG. 2, the LCD device according to the present invention includes: a panel 110 in which a plurality of pixels are defined by intersections between a plurality of gate lines and a plurality of data lines; a touch screen 130 in which a plurality of touch electrodes 131 and 132 for sensing a touch are disposed; a plurality of touch electrode lines 133 and 134 that are respectively connected to the touch electrodes 131 and 132 in a non-display area; a controller 510 that controls the driving of the gate lines and data lines disposed in the panel 110; a touch IC 610 that determines whether the touch electrodes 131 and 132 are touched using a sensing signal generated by a driving signal applied to the touch electrodes 131 and 132; a touch board connector 620 that is mounted on the touch board 600 with the touch IC 610 mounted thereon and connected to the touch IC 610; an FPC 630 for electrically connecting the touch electrode lines 133 and 134 to the touch board connector 620; a common voltage generator 520 that supplies a common voltage to a plurality of common electrodes disposed in the panel 110; and a compensation signal generator 530 that inverts a feedback common voltage Vcom_FB fed back from the panel 110 and transfers the inverted voltage to the touch board connector 620.

The panel 110 may be configured in a type where a liquid crystal layer (not shown) is formed between two glass substrates (not shown).

A lower glass substrate of the panel 110 includes the plurality of data lines, the plurality of gate lines intersecting the data lines, a plurality of thin film transistors (TFTs) disposed in respective intersection portions of the data lines and the gate lines, a plurality of pixel electrodes for charging the respective pixels with data voltages, and the plurality of common electrodes for driving liquid crystal injected into the liquid crystal layer together with the respective pixel electrodes. Here, the plurality of pixels are arranged in a matrix type by intersections between the data lines and the gate lines.

A black matrix and a color filter are disposed in plurality, in an upper glass substrate of the panel 110. The common electrode, as described above, may be disposed in the lower glass substrate, or disposed in the upper glass substrate.

Polarizers are respectively adhered to the upper glass substrate and lower glass substrate of the panel 110, and an alignment layer for setting a pretilt angle of the liquid crystal is formed at an inner plane contacting the liquid crystal. A column spacer CS for maintaining a cell gap of a liquid crystal cell (not shown) may be formed in plurality between the upper glass substrate and lower glass substrate of the panel 110.

The touch screen 130 senses a user's touch, and may be a capacitive touch screen using a mutual type or a capacitive touch screen using a self-cap type. The touch screen 130 includes the plurality of touch electrodes 131 and 132 and the plurality of touch electrode lines 133 and 134. In the self-cap type, the FPC 630 for connecting the touch screen according to the present invention may be provided as only one. Hereinafter, for convenience of description, the mutual capacitive touch screen will be described as an example of the present invention.

The plurality of touch electrodes may be categorized into a plurality of driving electrodes 131 and a plurality of receiving electrodes 132. The plurality of touch electrode lines may be categorized into a plurality of driving electrode lines 133 connected to the respective driving electrodes 131 and a plurality of receiving electrode lines 134 connected to the respective receiving electrodes 132.

The driving electrode lines 133 and the receiving electrode lines 134 are arranged in the non-display area of the panel 110. The driving electrode lines 133 and the receiving electrode lines 134 may be connected to the touch IC 610 through the FPC 630 for connecting the touch screen.

The driving electrodes 131 and receiving electrodes 132 configuring the touch electrodes may be arranged in a lattice structure to be respectively parallel to the gate lines and the data lines, on the panel 110. In addition, the driving electrodes 131 and the receiving electrodes 132 may be arranged in various types.

The touch screen 130 is provided in various types, in the LCD device.

First, the touch screen 130 including the touch electrodes may be built in the lower glass substrate together with the data lines and the gate lines, in which case the touch electrodes may be used as the common electrodes. Second, the touch screen 130 may be disposed on the upper glass substrate, in which case the touch electrodes may be used as the common electrodes. Third, the touch screen 130 may be manufactured as an object independent of the panel 110 and then adhered to an upper end of the upper glass substrate configuring the panel 110, in which case the common electrode disposed in the panel 110 and the touch electrode disposed in the touch screen may be formed in different shapes.

While the common voltage is being applied to the panel 110, when a driving signal (driving voltage) for touch sensing is applied to the touch screen 130, the present invention prevents the driving signal or a sensing signal from being distorted by the common voltage, and may be applied to the above-described LCD devices having three structures.

That is, as in the first and second schemes, even when the driving signal for touch sensing and the common voltage is applied to the panel 110 or the touch screen 130 by a time-division scheme, the driving signal and the sensing signal can be distorted by the common voltage, or noise can be added into the driving signal and the sensing signal. To overcome such limitations, the present invention may be applied to this case.

Hereinafter, however, for convenience of description, as in the third scheme, the touch screen 130 including the touch electrodes 131 and 132 provided independently of the common electrodes of the panel 110 will be described as an example of the present invention.

A panel connection part 550 electrically connects the panel 110 to the controller 510 mounted on the main board 500. Image data signals RGB, a data control signal, a gate control signal, and the common voltage may be transferred to the panel 110 through the panel connection part 550.

The panel connection part 550 may be configured in a type where a plurality of lines for transferring the above-described signals or voltages are provided, configured in a chip-on film (COF) type where a data driver IC is mounted, or configured in various types depending on the characteristics and kinds of panels, on the FPC. The panel connection part 550 applied to the present invention may use a panel connection part generally applied to LCD devices, and thus, its detailed description is not provided.

With the main board connector 540 being mounted on the main board 500, the main board connector 540 is connected to a distal end of one side of the panel connection part 550, and connects the controller 510 to the panel 110 connected to a distal end of the other side of the panel connection part 550. The main board connector 540 applied to the present invention may use a main board connector generally applied to LCD devices, and thus, its detailed description is not provided.

The controller 510 generates a gate control signal GCS and a data control signal DCS with a timing signal transferred from the external system in order for the panel 110 to display an image, and realigns input video data signals according to a pixel type of the panel 110.

If the present invention is applied to a television or a monitor, the controller 510 may be the timing controller, or, if the present invention is applied to a portable terminal such as a smart phone, the controller 510 may be the display driver IC (DDI).

The controller 510 may control the common voltage generator 520, thereby allowing the common voltage to be applied to the common electrodes of the panel 110.

The controller 510 applied to the present invention may be configured in various types as described above. A configuration and function of the controller 510 may use those of a controller generally applied to LCD devices, and thus, their detailed description is not provided.

The common voltage generator 520 applies the common voltage to the common electrodes disposed in the panel 110. A configuration and function of the common voltage generator 520 are the same as those of a general common voltage generator, and thus, their detailed description is not provided.

The compensation signal generator 530 inverts the feedback common voltage Vcom_FB fed back from the panel 110 and transfers the inverted voltage to the touch board connector 620. A configuration and function of the compensation signal generator 530 will be described in detail with reference to FIGS. 4A and 4B.

The touch IC 610 applies the driving signal to the touch electrodes 131 and 132, and determines whether there is a touch or a touched position by using a plurality of sensing signals received from the respective touch electrodes 131 and 132. To this end, the touch IC 610 may include a touch driving unit for applying the driving signal to the touch electrodes 131 and 132 and a touch sensing unit for determining whether there is a touch or a touched position by using the sensing signals received from the respective touch electrodes 131 and 132.

A configuration and function of the touch IC 610 are the same as those of a touch IC which are generally used at present, and thus, their detailed description is not provided.

The FPC 630 is for connecting the touch electrode lines 133 and 134, disposed in the non-display area of the panel 110, to the touch IC 610 mounted on the touch board 600. One side of the FPC 630 is adhered to a pad of the touch electrode lines disposed in the non-display area of the panel 110, and the other side is connected to the touch board connector 620 mounted on the touch board 600.

The FPC 630 may be categorized into a driver FPC (Tx FPC) that applies the driving signal to the touch screen and a sensor FPC (Rx FPC) that transfers a sensing signal, generated by the touch screen 130, to the touch IC 610.

In each of the driver FPC and sensing FPC, a feedback compensation signal electrode receiving the feedback compensation signal for counteracting noise occurring in the panel 110 and a touch line connected to a corresponding touch electrode line are provided in plurality with an insulating layer therebetween.

Hereinafter, a configuration and function of the FPC 630 for connecting the touch screen will be described in detail with reference to FIGS. 7A and 7B.

The touch board connector 620 is mounted on the touch board 600, and connects the FPC 630 and the touch IC 610. Unlike a related art FPC for connecting a touch screen, the FPC 630 further includes the feedback compensation signal electrodes, and thus, a plurality of pins for connecting the feedback compensation signal electrodes to the compensation signal generator 530 are additionally provided in the touch board connector 620.

Moreover, a configuration and function of the touch board connector 620 will be described below in detail with reference to FIGS. 7A and 7B.

Figure 4A:
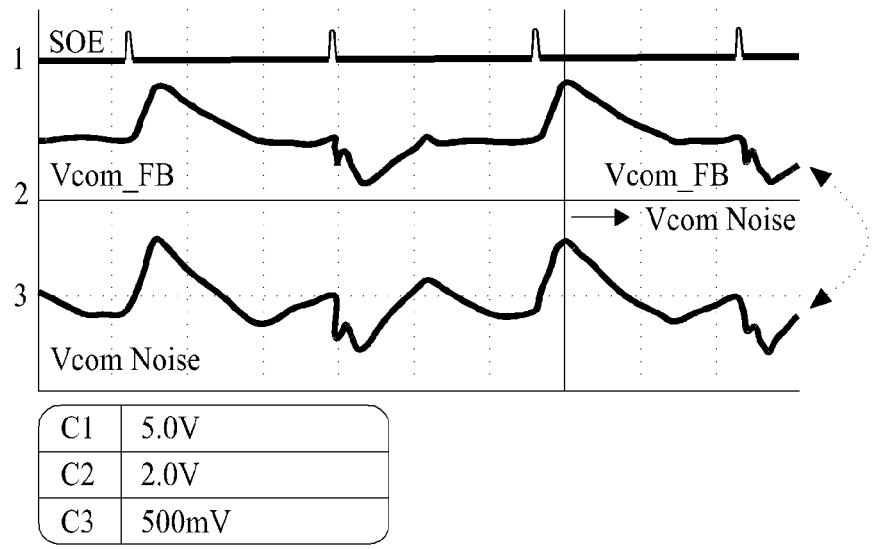
FIG. 4A is an exemplary diagram showing a waveform of a noise common voltage generated by application of a common voltage and a waveform of a feedback common voltage received from the panel to a compensation signal generator, in the panel of the LCD device according to the present invention.
Figure 4B:
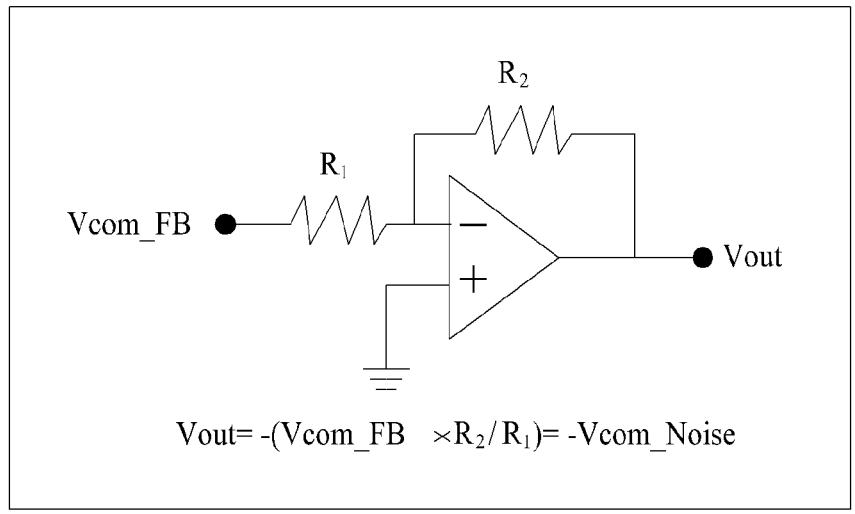
FIG. 4B is an exemplary diagram illustrating a configuration of the compensation signal generator applied to the LCD device according to the present invention.
Figure 5:
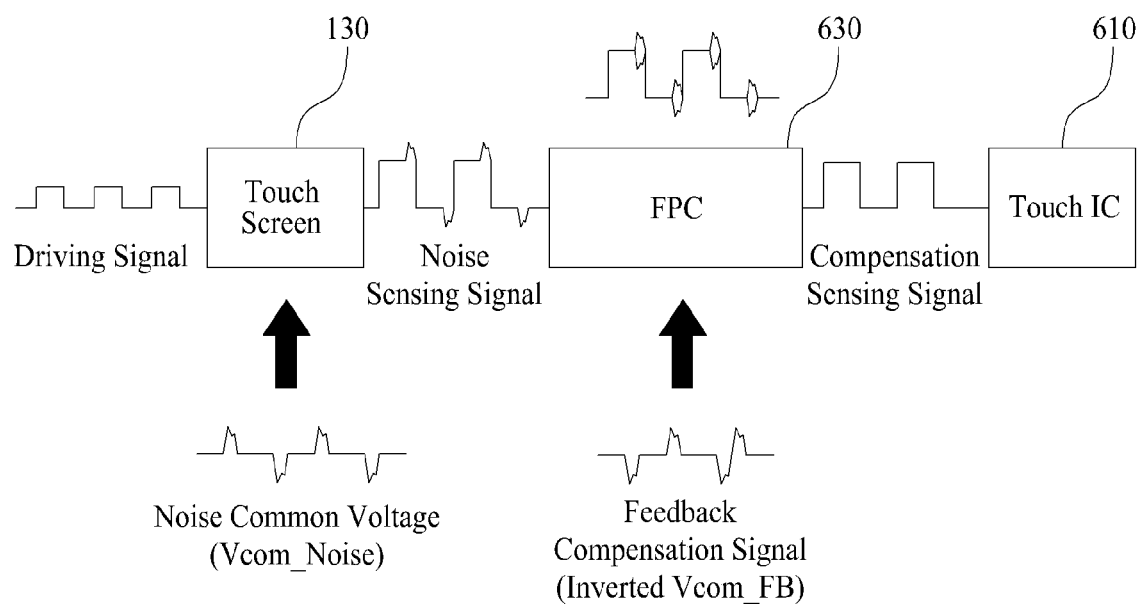
FIG. 5 is an exemplary diagram illustrating an operation in which noise is removed from a noise sensing signal by the feedback compensation signal, in an FPC for connecting a touch screen according to the present invention.
Figure 6A:
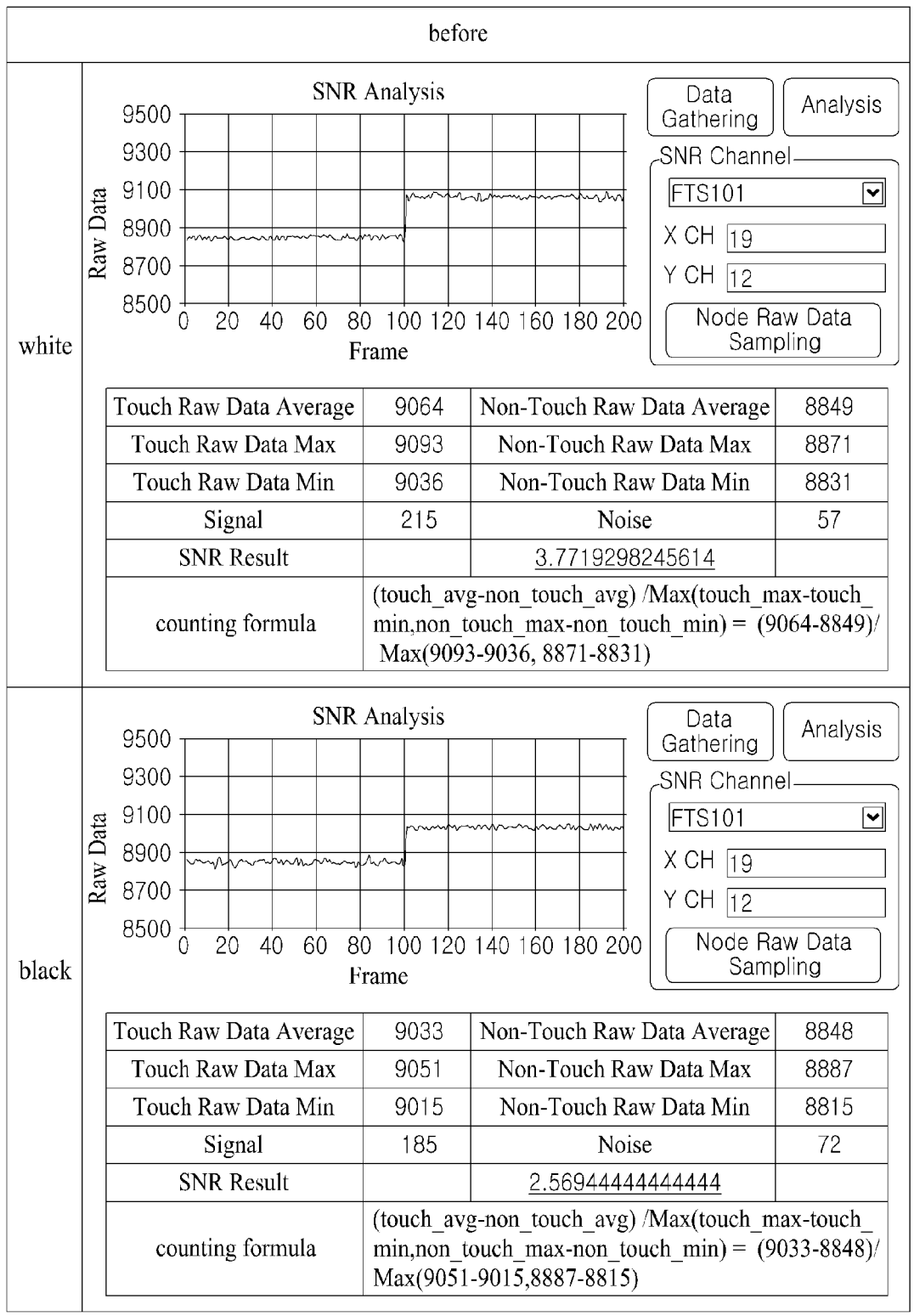
FIGS. 6A and 6B are graphs showing signal-to-noise ratios (SNRs) analyzed through the FPC for connecting the touch screen according to the present invention.
Figure 6B:
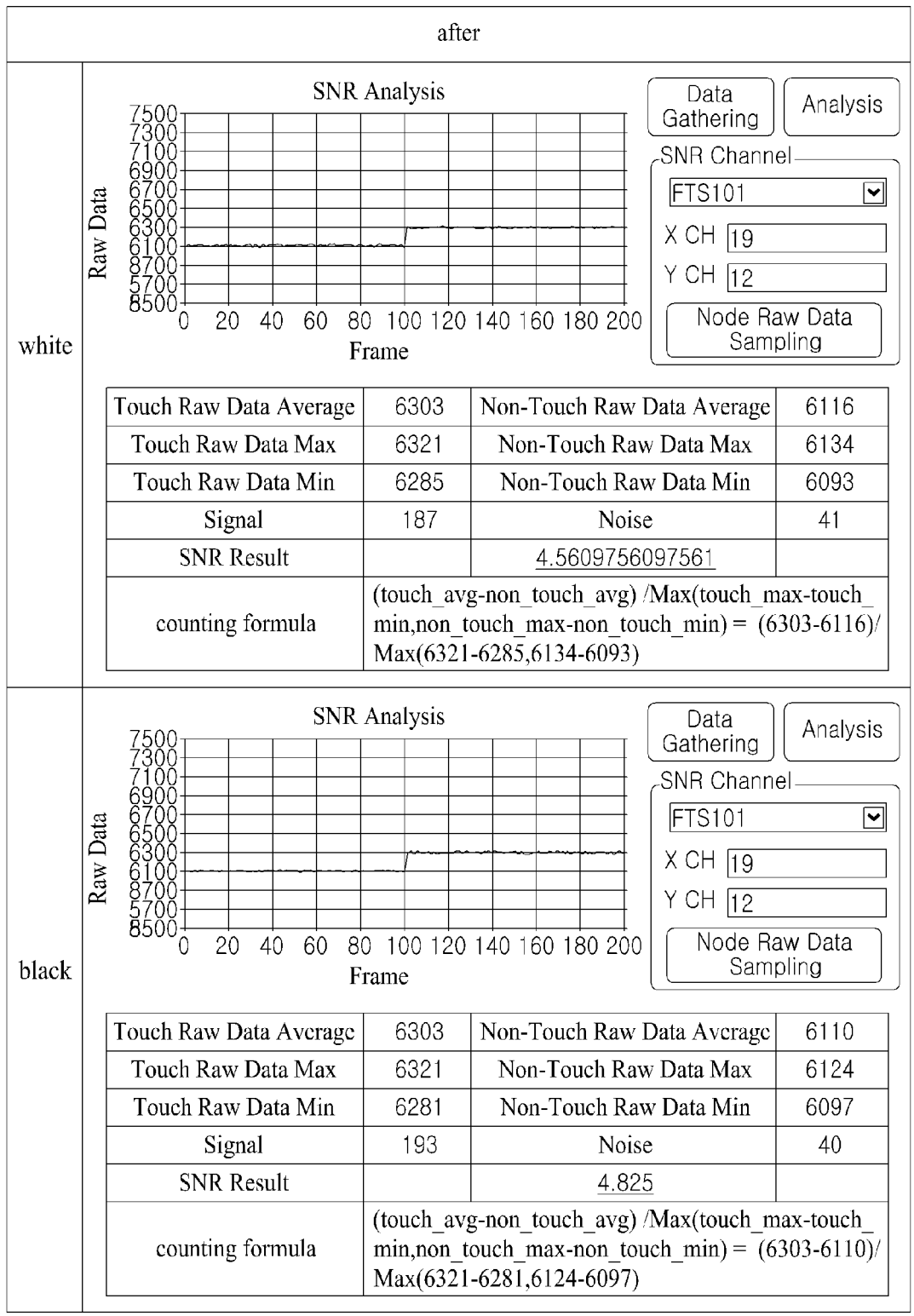

FIG. 4A is an exemplary diagram showing a waveform of the noise common voltage (Vcom Noise) generated by application of the common voltage and a waveform of the feedback common voltage Vcom_FB received from the panel to the compensation signal generator, in the panel of the LCD device according to the present invention. FIG. 4B is an exemplary diagram illustrating a configuration of the compensation signal generator 530 applied to the LCD device according to the present invention. FIG. 5 is an exemplary diagram illustrating an operation in which noise is removed from a noise sensing signal by the feedback compensation signal, in the FPC for connecting the touch screen according to the present invention. FIGS. 6A and 6B are graphs showing signal-to-noise ratios (SNRs) analyzed through the FPC for connecting the touch screen according to the present invention.

In the LCD device according to the present invention, the common voltage Vcom passes through common electrodes and common lines of the panel 110, at which point noise is added into the common voltage by an interaction between elements (gate line, data line, pixel electrode, etc.) disposed in the panel 110.

A common voltage applied to the driving electrode and including noise is called the noise common voltage (Vcom Noise), which is input to the compensation signal generator 530 through the panel 110. That is, the noise common voltage having noise which is added thereto in passing through the panel 110 is input to the compensation signal generator 530 in a type of the feedback common voltage Vcom_FB. Therefore, as shown in FIG. 4A, the feedback common voltage Vcom_FB input to the compensation signal generator 530 has a form similar to the noise common voltage (Vcom Noise).

The compensation signal generator 530 inverts the feedback common voltage Vcom_FB fed back from the panel 110 and transfers the inverted voltage to the touch board connector 620. To this end, as illustrated in FIG. 4B, the compensation signal generator 530 includes an amplifier, a first resistor R1 connected to an input terminal receiving the feedback common voltage Vcom_FB, and a second resistor R2 disposed on a feedback line between an output terminal Vout and the input terminal.

An output signal which is output through the output terminal of the compensation signal generator 530 is a signal into which the feedback common voltage is inverted, and, as described above, is the feedback compensation signal applied to the touch board connector 620. That is, the present invention inverts the feedback common voltage Vcom_FB to generate the feedback compensation signal by using the compensation signal generator 530, and applies the feedback compensation signal to the feedback compensation signal electrode of the FPC 630 through the touch board connector 620.

The feedback compensation signal, as described above, is a signal (inverted Vcom_FB) into which the feedback common voltage Vcom_FB is inverted. Therefore, as illustrated in FIG. 5, the feedback compensation signal (inverted Vcom_FB) applied to the feedback compensation signal electrode of the FPC 630 is counteracted with the noise common voltage (Vcom Noise) included in the noise sensing signal transferred through the touch line, thereby removing noise from the noise sensing signal.

A compensation sensing signal having no noise is applied to the touch IC 610, and the touch IC 610 may determine whether there is a touch or a touched position by using the compensation sensing signal having no noise. In FIG. 5, a mutual type sensing signal is illustrated as an example of the present invention. However, as described above, the present invention may use a mutual type driving signal, or may be applied to the touch screen using the self-cap type.

Moreover, FIG. 5 illustrates an operation in which noise is removed from the noise sensing signal including the noise by using the feedback compensation signal, but the present invention may be identically applied to an operation in which noise is removed from the noise driving signal including the noise by using the feedback compensation signal.

An experiment for verifying the above-described present invention may be performed by the following method.

First, an on-cell touch screen of 10.1 inch is prepared.

A conductive tape is adhered to the sensor FPC (Rx FPC) connected to the touch sensing unit of the touch IC 610, and the feedback compensation signal (inverted Vcom_FB) generated by the main board 500 (source PCB) is connected to the conductive tape.

When the feedback compensation signal (inverted Vcom_FB) has been applied to the FPC 630, first raw data of a sensing signal is measured.

A conductive rod touches a specific position (Rx:20, Tx:13) of the touch screen 130, and then second raw data of the sensing signal is measured.

Finally, by analyzing SRN data of the measured first and second raw data, the amount of noise removed from the sensing signal can be verified.

An example of the analyzed result is shown in FIGS. 6A and 6B. Specifically, in a panel driven in a normal white mode, comparing an SNR prior to the application of the present invention with an SNR subsequent to the application of the present invention, it can be seen that the SNR is increased from 3.77 to 4.5, namely, by about 12%. Also, in a panel driven in a normal black mode, comparing an SNR prior to the application of the present invention with an SNR subsequent to the application of the present invention, it can be seen that the SNR is increased from 2.57 to 4.83, namely, by about 88%.

As expressed in the following Equation (1), an SNR denotes a value which is obtained by dividing the level of a signal by the level of noise, and the SNR being increased denotes the level of noise being decreased. Therefore, when the present invention is applied, it can be seen that the SNR is improved.

$$SNR = \frac{Signal}{Noise} \quad (1)$$

where Noise denotes the greater value of T_V and NT_V because noise may be expressed as Max [T_V, NT_V]. Here, T_V(Touch_Variation) denotes Touch Raw Data(Max-Min), namely, denotes the amount of changed raw data when the touch screen 130 is touched, and NT_V(Nontouch_Variation) denotes Non_Touch Raw Data(Max-Min), namely, denotes the amount of changed raw data when the touch screen 130 is not touched. Also, Signal may be expressed as "Touch Average(T_V)–Non_Touch Average(NT_V)". Here, Touch Average(T_V) denotes an average value of T_V, and Non_Touch Average(NT_V) denotes an average value of NT_V.

Figure 7A:
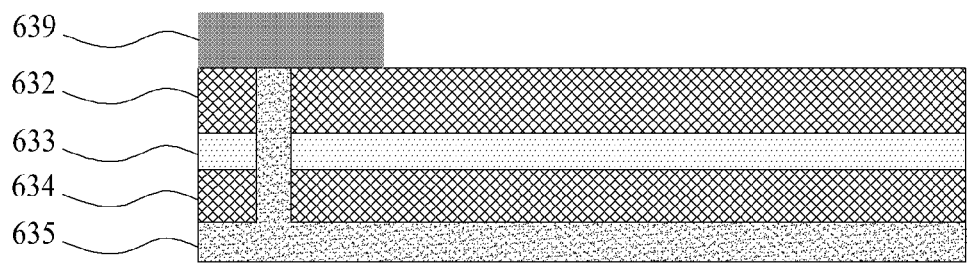
FIG. 7A is a sectional view illustrating the FPC for connecting the touch screen according to the present invention.

FIG. 7A is a sectional view illustrating the FPC for connecting the touch screen according to the present invention. FIG. 7B is an exemplary diagram illustrating a state in which the FPC for connecting the touch screen according to the present invention has been connected to a touch board connector.

As described above, the present invention applies the feedback compensation signal (inverted Vcom_FB), into which the feedback common voltage Vcom_FB generated by the panel 110 is inverted, to the FPC 630 which receives a noise sensing signal including noise or a noise driving signal including noise, thereby removing the noise from the noise sensing signal or the noise driving signal.

Figure 7B:
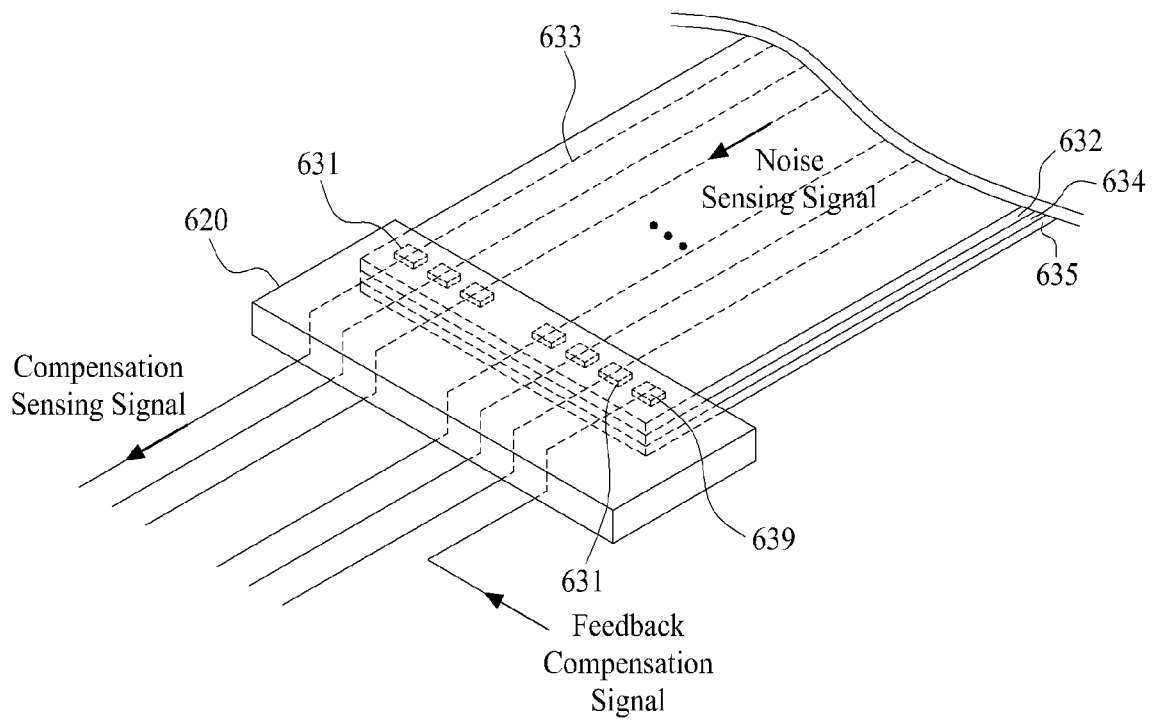
FIG. 7B is an exemplary diagram illustrating a state in which the FPC for connecting the touch screen according to the present invention has been connected to a touch board connector.

To this end, as illustrated in FIGS. 7A and 7B, the FPC 630 for connecting the touch screen according to the present invention may include: a plurality of touch lines 633 connected to the respective touch electrode lines 133 or 134; a first flexible film 634 to which the touch lines 633 are adhered; a second flexible film 632 that overlaps the first film 634 at an upper end surface of the first film 634 and covers the touch lines 633; a feedback compensation signal electrode 635 that is adhered to a lower end surface of the first film 634 and receives the feedback compensation signal; a plurality of touch line pads 631 that are arranged at a distal end of one side of the second film 632 and connected to the respective touch lines 633; and a feedback compensation signal electrode pad 639 that is disposed at the distal end of one side of the second film 632 in parallel to the touch line pads 631 and connected to the feedback compensation signal electrode 635.

The touch line 633 is connected to the driving electrode line 133 or receiving electrode line 134 disposed in the non-display area of the panel 110. When the FPC 630 of FIGS. 7A and 7B is the sensor FPC connected to the receiving electrode line 134, the touch line 633 is a sensor touch line connected to the receiving electrode line 134, and when the FPC 630 of FIGS. 7A and 7B is the driver FPC connected to the driving electrode line 133, the touch line 633 is a driver touch line connected to the driving electrode line 133. Hereinafter, for convenience of description, a case in which the touch line 633 is the sensor touch line will be described as an example of the present invention.

When the touch line 633 is the sensor touch line as described above, the noise sensing signal including noise is transferred from other side of the sensor touch line, connected to the touch screen 130, to one side of the sensor touch line in which the pads 631 and 639 are disposed.

The first film 634 is a film which is flexible and has insulating properties, and the touch line 633 is disposed at the upper end surface of the first film 634. A polyimide resin or the like may be applied as a material of the first film 634. In addition, materials used as a base film of the FPC may be applied to the first film 634.

The second film 632 may be formed of the same material as the first film 634, and is adhered to the upper end surface of the first film 634 with the touch lines 633 therebetween.

The feedback compensation signal electrode 635 is an electrode receiving the feedback compensation signal and may be formed as a plurality of lines corresponding to the respective touch lines 633, but may be formed in one plate (film) shape.

The touch line pad 631 is connected to the touch line 633 and connected to a touch line pad pin (not shown) of the touch board connector 620. A distal end of the touch line 633 may be disposed on the first film 634 to be exposed from the second film 632, in order for the touch line pad 631 to be connected to the touch line 633. In another embodiment, the touch line pad 631 may be connected to the touch line 633 through a touch line hole that is formed in the second film 632 in order for the touch line 633 to be exposed.

The feedback compensation signal electrode pad 639 is connected to the feedback compensation signal electrode 635. A feedback compensation signal electrode hole may be formed in each of the first and second films 634 and 632 in order for the feedback compensation signal electrode pad 639 to be connected to the feedback compensation signal electrode 635. The feedback compensation signal electrode pad 639 is connected to a feedback compensation signal electrode pad pin (not shown) of the touch board connector 620.

The pads 631 and 639 of the FPC 630 according to the present invention, configured as described above, are electrically connected to respective pins disposed in the sensor touch board connector 620.

A plurality of touch line pad pins (not shown) connected to the respective touch line pads 631 are connected to the touch sensing unit of the touch IC 610, and the feedback compensation signal electrode pad pin (not shown) connected to the feedback compensation signal electrode pad 639 is connected to the compensation signal generator 530 through a feedback compensation signal transfer line 700 (see FIG. 3).

According to the embodiments of the present invention, the feedback compensation signal electrode receiving the feedback compensation signal for counteracting noise occurring in the panel and the touch line connected to the touch electrode disposed in the touch screen are provided in plurality, thus removing noise included in a sensing signal applied to the touch IC.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A Flexible Printed Circuit (FPC) for connecting a touch screen, comprising:
   a plurality of touch lines respectively connected to a plurality of touch electrode lines;
   a first film adhered to the touch lines;
   a second film overlapping the first film at an upper end surface of the first film and covering the touch lines; and
   a feedback compensation signal electrode adhered to a lower end surface of the first film, and receiving a feedback compensation signal for removing noise,
   wherein the feedback compensation signal electrode is provided as a plurality of lines disposed under and respectively corresponding to the touch lines in a one-to-one manner, and
   wherein the feedback compensation signal electrode receives the feedback compensation signal that inverts a feedback common voltage from a display panel.

2. The FPC of claim 1, wherein,
   a plurality of touch line pads respectively connected to a plurality of touch line pins of a touch board connector are disposed at respective distal ends of the touch lines, and
   a feedback compensation signal electrode pad connected to a feedback compensation signal electrode pin of the touch board connector is disposed at a distal end of the feedback compensation signal electrode.

3. The FPC of claim 2, wherein,
   the touch lines are respectively connected to a plurality of driving electrode lines receiving a noise driving signal having noise among the touch electrode lines, and
   the touch line pads are respectively connected to a plurality of touch line pins connected to a touch driver of a touch IC among a plurality of pins arranged in the touch board connector.

4. The FPC of claim 2, wherein,
   the touch lines are respectively connected to a plurality of receiving electrode lines receiving a noise sensing signal having noise among the touch electrode lines, and
   the touch line pads are respectively connected to a plurality of touch line pins connected to a touch sensing unit of a touch IC among a plurality of pins arranged in the touch board connector.

5. A Liquid Crystal Display (LCD) device, comprising:
   a panel, a plurality of data lines and a plurality of gate line being arranged in the panel;
   a touch screen comprising a plurality of touch electrodes for sensing a touch;
   a plurality of touch electrode lines respectively connected to the touch electrodes;
   a touch IC determining whether the touch electrodes are touched using a sensing signal generated by a driving signal applied to the touch electrodes;
   a touch board connector mounted on the touch board with the touch IC mounted thereon, and connected to the touch IC;
   a Flexible Printed Circuit (FPC) connecting the touch electrode lines to the touch board connector;
   a common voltage generator supplying a common voltage to a plurality of common electrodes disposed in the panel; and
   a compensation signal generator inverting a noise signal fed back from a feedback common voltage from the panel to generate a feedback compensation signal, and transferring the feedback compensation signal to the touch board connector,
   wherein a feedback compensation signal electrode receiving the feedback compensation signal through the touch board connector and a plurality of touch lines respectively connected to the plurality of the touch electrode lines are disposed in the FPC,
   the touch lines are adhered to an upper end surface of a first film and the feedback compensation signal electrode is adhered to a lower end surface of the first film, and
   the feedback compensation signal electrode is provided as a plurality of lines disposed under and respectively corresponding to the touch lines in a one-to-one manner, and
   wherein the feedback compensation signal electrode receives the inverted noise signal fed back from the panel.

6. The LCD device of claim 5, wherein,
   the noise signal is a feedback common voltage which is applied from the common voltage generator to the panel and fed back from the panel with noise being added into the feedback common voltage, and
   the feedback compensation signal is generated by inverting the feedback common voltage.

7. The LCD device of claim 5, wherein,
   the FPC is a driver FPC that transfers a driving signal applied to the touch screen, or
   the FPC is a sensor FPC that applies a sensing signal, applied from the touch screen, to the touch IC.

8. The LCD device of claim 5, wherein,
   the touch screen is a capacitive touch screen using a mutual type, or
   the touch screen is a capacitive touch screen using a self-cap type.

9. The LCD device of claim 5, wherein,
   the touch screen and the panel are provided as one body, or
   the touch screen is adhered to an upper glass substrate configuring the panel.

* * * * *